(12) United States Patent
Yuen et al.

(10) Patent No.: US 10,720,758 B2
(45) Date of Patent: Jul. 21, 2020

(54) EMITTER ARRAY WITH SHARED VIA TO AN OHMIC METAL SHARED BETWEEN ADJACENT EMITTERS

(71) Applicant: Lumentum Operations LLC, Milpitas, CA (US)

(72) Inventors: Albert Yuen, Palo Alto, CA (US); Ajit Vijay Barve, San Jose, CA (US)

(73) Assignee: Lumentum Operations LLC, Milpitas, CA (US)

( * ) Notice: Subject to any disclaimer, the term of this patent is extended or adjusted under 35 U.S.C. 154(b) by 0 days.

(21) Appl. No.: 16/363,753

(22) Filed: Mar. 25, 2019

(65) Prior Publication Data

US 2019/0305522 A1 Oct. 3, 2019

Related U.S. Application Data

(60) Provisional application No. 62/649,366, filed on Mar. 28, 2018.

(51) Int. Cl.
| | |
|---|---|
| *H01S 5/42* | (2006.01) |
| *H01S 5/042* | (2006.01) |
| *H01S 5/028* | (2006.01) |
| *H01S 5/183* | (2006.01) |
| *H01S 5/343* | (2006.01) |

(52) U.S. Cl.
CPC .............. *H01S 5/423* (2013.01); *H01S 5/028* (2013.01); *H01S 5/0425* (2013.01); *H01S 5/18308* (2013.01); *H01S 5/18361* (2013.01); *H01S 5/34313* (2013.01)

(58) Field of Classification Search
CPC .... H01S 5/423; H01S 5/0425; H01S 5/04252; H01S 5/04254; H01S 5/04256; H01S 5/18311–18313; H01S 5/0282–0283; H01S 2301/176
See application file for complete search history.

(56) References Cited

U.S. PATENT DOCUMENTS

| | | | | |
|---|---|---|---|---|
| 5,978,408 A | * | 11/1999 | Thornton | ............ H01S 5/18338 372/45.01 |
| 6,507,595 B1 | * | 1/2003 | Kapon | ............... H01S 5/18386 257/81 |
| 2006/0269666 A1 | * | 11/2006 | Nagawa | ................. B82Y 20/00 427/248.1 |
| 2015/0222094 A1 | * | 8/2015 | Lee | ......................... H01S 5/423 372/38.05 |

* cited by examiner

*Primary Examiner* — Tod T Van Roy
*Assistant Examiner* — Sean P Hagan
(74) *Attorney, Agent, or Firm* — Harrity & Harrity, LLP

(57) ABSTRACT

An emitter array may comprise a plurality of emitters that includes two adjacent emitters. The ohmic metal layer may include a portion that is shared by, and located between, the two adjacent emitters. The emitter array may comprise a protective layer over the ohmic metal layer. The emitter array may comprise a via through the protective layer to the portion. The via is shared by, and located between, the two adjacent emitters.

20 Claims, 7 Drawing Sheets

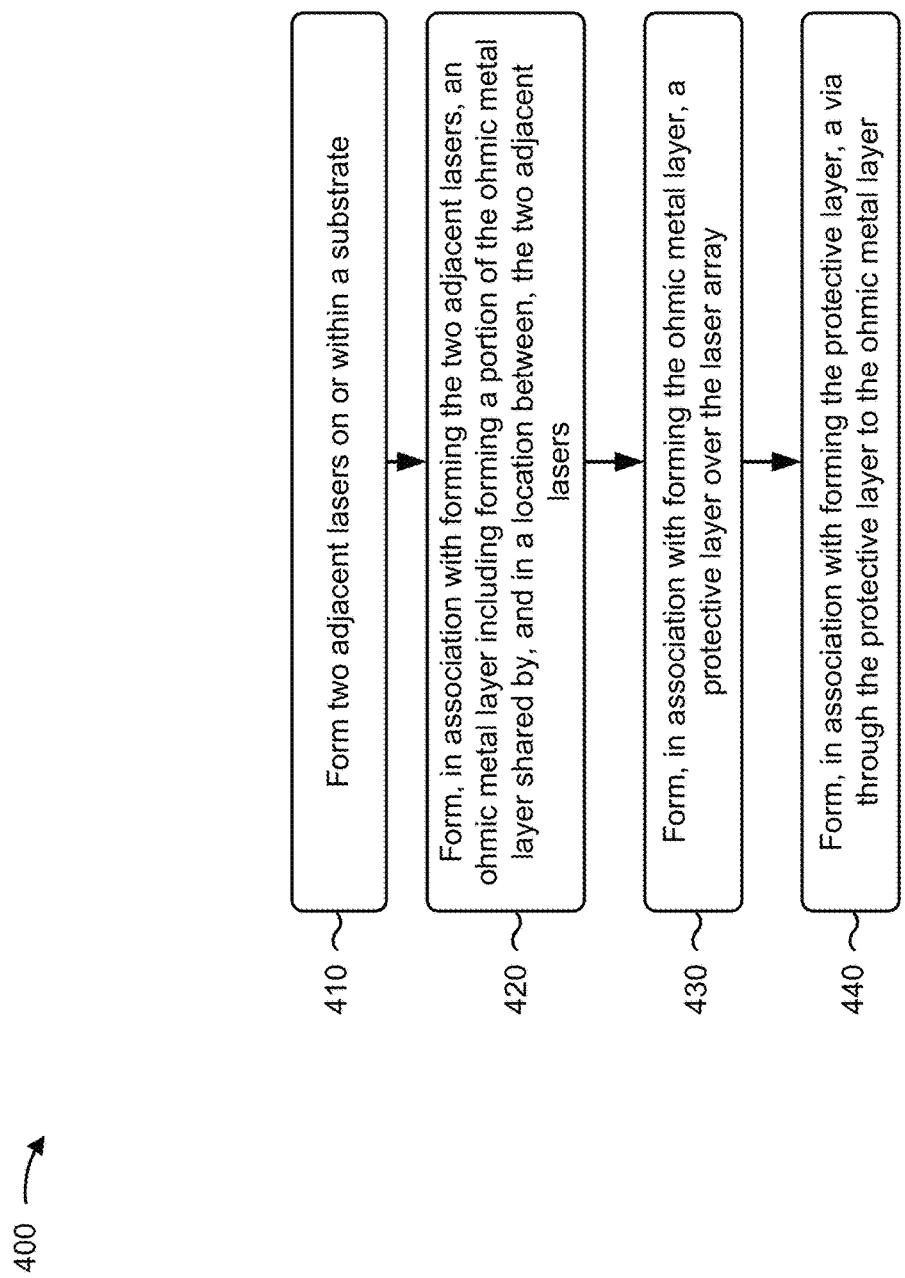

US 10,720,758 B2

EMITTER ARRAY WITH SHARED VIA TO AN OHMIC METAL SHARED BETWEEN ADJACENT EMITTERS

RELATED APPLICATION

This application claims priority under 35 U.S.C. § 119 to U.S. Provisional Patent Application No. 62/649,366, filed on Mar. 28, 2018, the content of which is incorporated by reference herein in its entirety.

TECHNICAL FIELD

The present disclosure relates to an emitter array and, more particularly, to an emitter array with shared via to an ohmic metal shared between adjacent emitters.

BACKGROUND

An emitter can include a vertical-emitting device, such as a vertical cavity surface emitting laser (VCSEL). A VCSEL is a laser in which a beam is emitted in a direction perpendicular to a surface of the VCSEL (e.g., vertically from a surface of the VCSEL). Multiple emitters may be arranged in an emitter array with a common substrate.

SUMMARY

According to some implementations, a vertical cavity surface emitting laser (VCSEL) array, may comprise: a plurality of VCSELs including two adjacent VCSELs; an ohmic metal layer associated with the plurality of VCSELs; and a protective layer over the ohmic metal layer, wherein the protective layer includes a via to the ohmic metal layer, wherein the via is shared between the two adjacent VCSELs of the plurality of VCSELs.

According to some implementations, an emitter array, may comprise: a plurality of emitters that includes two adjacent emitters; an ohmic metal layer associated with the plurality of emitters, wherein the ohmic metal layer includes a portion that is shared by, and located between, the two adjacent emitters; a protective layer over the ohmic metal layer; and a via through the protective layer to the portion, wherein the via is shared by, and located between, the two adjacent emitters.

According to some implementations, a method of forming a laser array may comprise: forming two adjacent lasers on or within a substrate; forming, in association with forming the two adjacent lasers, an ohmic metal layer including forming a portion of the ohmic metal layer shared by, and in a location between, the two adjacent lasers; forming, in association with forming the ohmic metal layer, a protective layer over the laser array; and forming, in association with forming the ohmic metal layer, a via through the protective layer to the ohmic metal layer.

BRIEF DESCRIPTION OF THE DRAWINGS

FIG. 4 is a flow chart of an example process for forming an emitter array with shared via to an ohmic metal shared between adjacent emitters.

DETAILED DESCRIPTION

Figure 1A:
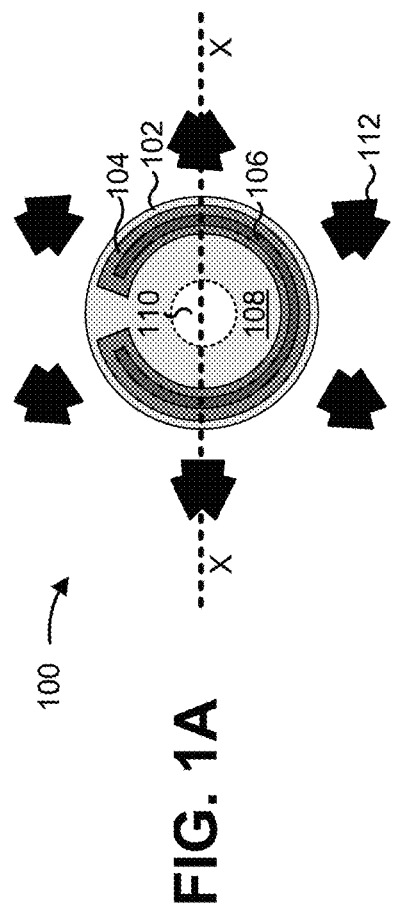
FIGS. 1A and 1B are diagrams depicting a top-view of an example vertical-emitting device and a cross-sectional view of the example vertical-emitting device, respectively.

The following detailed description of example implementations refers to the accompanying drawings. The same reference numbers in different drawings may identify the same or similar elements.

Emitter arrays are used in various applications. For example, emitter arrays are used in three-dimensional sensing applications, such as structured light applications, time-of-flight applications, light detection and ranging (LIDAR) applications, and/or the like. An emitter array includes multiple emitters, such as multiple vertical light-emitting devices formed on a chip which is in turn formed on a wafer. Typically, an emitter includes a mesa structure that includes an ohmic metal layer around an aperture of the emitter (e.g., in a ring or partial ring shape) and a set of vias through protective layers down to the ohmic metal layer (e.g., also in a ring or partial ring shape that matches the shape of the ohmic metal layer). In addition, the emitter array includes trenches between the mesa structure of the emitter (and in some cases that form the mesa structure) and one or more other emitters of the emitter array. For example, the trenches are often formed around the ohmic metal layer and/or the corresponding set of vias of the emitter. This configuration of an emitter and/or an emitter array (e.g., where a trench is formed around the ohmic metal layer and the corresponding set of vias) often results in narrow manufacturing tolerances and/or often requires a particular amount of chip space for each emitter of an emitter array. The more closely that the emitters of an emitter array can be spaced, the more the overall chip size can be reduced. Small chip sizes allow more chips per wafer and smaller chips can be placed in smaller packages, thereby reducing the overall cost of the chip and package.

Some implementations described herein provide an emitter array that is configured with multiple emitters where a via to an ohmic metal layer is shared between adjacent emitters. For example, the via may be in an interstitial area between (or adjacent to) two emitters and may be associated with a portion of an ohmic metal layer that is also shared between (or adjacent to) the two emitters, such that the portion of the ohmic metal layer electrically connects to each of the adjacent emitters. For example, the via may extend through a protective layer of the emitter array to the portion of the ohmic metal layer so that the via is shared between the two emitters. In this way, two adjacent emitters of an emitter array may share an ohmic metal layer and/or a via associated with the ohmic metal layer based on a portion of the ohmic metal layer and/or the via being located between the two adjacent emitters, rather than the two adjacent emitters including isolated vias in or on their respective mesa structures.

This configuration facilitates a reduction in an area of an ohmic metal layer and/or a via relative to previous configurations, thereby conserving space associated with the emitter array and increasing density of emitters per chip. In addition, this configuration facilitates smaller sized emitters (e.g., with smaller diameters) relative to previous configurations of emitters, thereby facilitating a reduction in a distance between emitters of the emitter array (e.g., emitter arrays with smaller pitch between emitters), a reduction in an overall chip size associated with the emitter array (e.g., smaller square area for the same number of emitters as prior designs), an increase in a quantity of emitters that can be included on a chip of a particular size (with particular dimensions compared to prior designs), and/or the like. In some applications, such as a three-dimensional sensing application, increasing a quantity of emitters in an emitter array on a chip of a particular size may improve operation of a device that uses the emitter array by providing the device with a higher quantity of points of light to use for three-dimensional sensing and/or by providing greater power or brightness from a chip of that particular size. Further, reducing a size of emitters on a chip, without increasing a quantity of emitters on the chip, provides wider manufacturing tolerances relative to previous designs of emitter arrays, thereby facilitating faster manufacturing of an emitter array, reduced costs of manufacturing an emitter array, a reduction in defects during manufacturing of an emitter array, a reduction in post-manufacturing defects from propagation of dislocations (e.g., the smaller emitter size, while maintaining a chip size, results in more distance between emitters, which may reduce a likelihood of a dislocation intersecting an emitter), and/or the like.

Figure 1B:
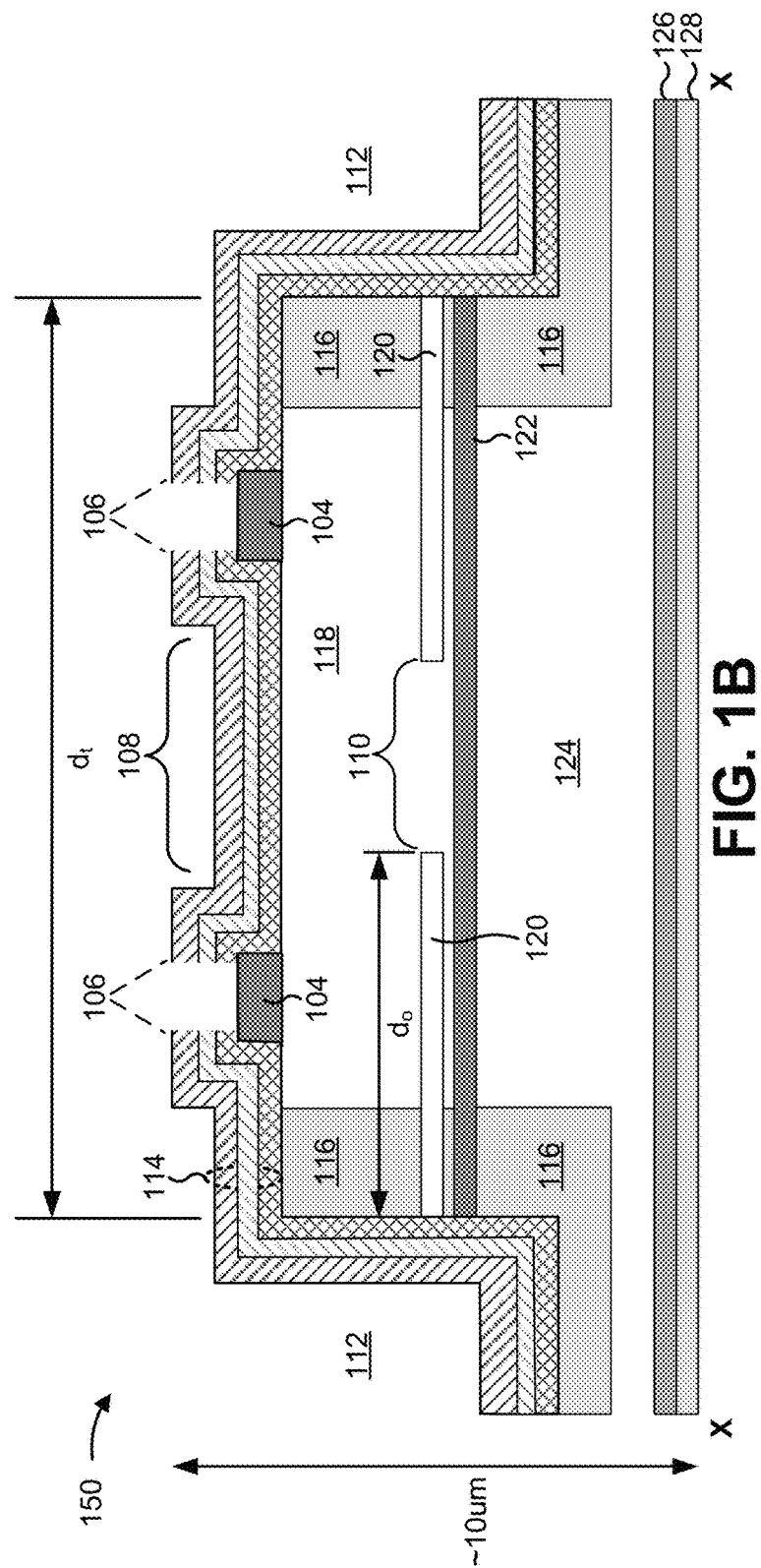

FIGS. 1A and 1B are diagrams depicting a top-view of an example emitter 100 and a cross-sectional view 150 of example emitter 100 along the line X-X, respectively. As shown in FIG. 1A, emitter 100 may include a set of emitter layers constructed in an emitter architecture. In some implementations, emitter 100 may correspond to one or more vertical-emitting devices described herein.

As shown in FIG. 1A, emitter 100 may include an implant protection layer 102 that is circular in shape in this example. In some implementations, implant protection layer 102 may have another shape, such as an elliptical shape, a polygonal shape, or the like. Implant protection layer 102 is defined based on a space between sections of implant material (not shown) included in emitter 100.

As shown by the medium gray and dark gray areas in FIG. 1A, emitter 100 includes an ohmic metal layer 104 (e.g., a P-Ohmic metal layer or an N-Ohmic metal layer) that is constructed in a partial ring-shape (e.g., with an inner radius and an outer radius). The medium gray area shows an area of ohmic metal layer 104 covered by a protective layer (e.g. a dielectric layer, a passivation layer, and/or the like) of emitter 100 and the dark gray area shows an area of ohmic metal layer 104 exposed by via 106, described below. As shown, ohmic metal layer 104 overlaps with implant protection layer 102. Such a configuration may be used, for example, in the case of a P-up/top-emitting emitter 100. In the case of a bottom-emitting emitter 100, the configuration may be adjusted as needed.

Not shown in FIG. 1A, emitter 100 includes a protective layer in which via 106 is formed (e.g., etched). The dark gray area shows an area of ohmic metal layer 104 that is exposed by via 106 (e.g., the shape of the dark gray area may be a result of the shape of via 106) while the medium grey area shows an area of ohmic metal layer 104 that is covered by some protective layer. The protective layer may cover all of the emitter other than the vias. As shown, via 106 is formed in a partial ring-shape (e.g., similar to ohmic metal layer 104) and is formed over ohmic metal layer 104 such that metallization on the protection layer contacts ohmic metal layer 104. In some implementations, via 106 and/or ohmic metal layer 104 may be formed in another shape, such as a full ring-shape or a split ring-shape.

As further shown, emitter 100 includes an optical aperture 108 in a portion of emitter 100 within the inner radius of the partial ring-shape of ohmic metal layer 104. Emitter 100 emits a laser beam via optical aperture 108. As further shown, emitter 100 also includes a current confinement aperture 110 (e.g., an oxide aperture formed by an oxidation layer of emitter 100 (not shown)). Current confinement aperture 110 is formed below optical aperture 108.

As further shown in FIG. 1A, emitter 100 includes a set of trenches 112 (e.g., oxidation trenches) that are spaced (e.g., equally, unequally) around a circumference of implant protection layer 102. How closely trenches 112 can be positioned relative to the optical aperture 108 is dependent on the application, and is typically limited by implant protection layer 102, ohmic metal layer 104, via 106, and manufacturing tolerances.

The number and arrangement of layers shown in FIG. 1A are provided as an example. In practice, emitter 100 may include additional layers, fewer layers, different layers, or differently arranged layers than those shown in FIG. 1A. For example, while emitter 100 includes a set of six trenches 112, in practice, other configurations are possible, such as a compact emitter that includes five trenches 112, seven trenches 112, and/or the like. In some implementations, trench 112 may encircle emitter 100 to form a mesa structure di. As another example, while emitter 100 is a circular emitter design, in practice, other designs may be used, such as a rectangular emitter, a hexagonal emitter, an elliptical emitter, or the like. Additionally, or alternatively, a set of layers (e.g., one or more layers) of emitter 100 may perform one or more functions described as being performed by another set of layers of emitter 100, respectively.

Notably, while the design of emitter 100 is described as including a VCSEL, other implementations are possible. For example, the design of emitter 100 may apply in the context of another type of optical device, such as a light emitting diode (LED), or another type of vertical emitting (e.g., top emitting or bottom emitting) optical device. Additionally, the design of emitter 100 may apply to emitters of any wavelength, power level, emission profile, and/or the like. In other words, emitter 100 is not particular to an emitter with a given performance characteristic.

As shown in FIG. 1B, the example cross-sectional view may represent a cross-section of emitter 100 that passes through, or between, a pair of trenches 112 (e.g., as shown by the line labeled "X-X" in FIG. 1A). As shown, emitter 100 may include a backside cathode layer 128, a substrate layer 126, a bottom mirror 124, an active region 122, an oxidation layer 120, a top mirror 118, an implant isolation material 116, a protective layer 114 (e.g. a dielectric passivation/mirror layer), and an ohmic metal layer 104. As shown, emitter 100 may have, for example, a total height that is approximately 10 µm.

Backside cathode layer 128 may include a layer that makes electrical contact with substrate layer 126. For example, backside cathode layer 128 may include an annealed metallization layer, such as an AuGeNi layer, a PdGeAu layer, or the like.

Substrate layer 126 may include a base substrate layer upon which epitaxial layers are grown. For example, substrate layer 126 may include a semiconductor layer, such as a GaAs layer, an InP layer, and/or the like.

Bottom mirror 124 may include a bottom reflector layer of emitter 100. For example, bottom mirror 124 may include a distributed Bragg reflector (DBR).

Active region 122 may include a layer that confines electrons and defines an emission wavelength of emitter 100. For example, active region 122 may be a quantum well.

Oxidation layer 120 may include an oxide layer that provides optical and electrical confinement of emitter 100. In some implementations, oxidation layer 120 may be formed as a result of wet oxidation of an epitaxial layer. For example, oxidation layer 120 may be an $Al_2O_3$ layer formed as a result of oxidation of an AlAs or AlGaAs layer. Trenches 112 may include openings that allow oxygen (e.g., dry oxygen, wet oxygen) to access the epitaxial layer from which oxidation layer 120 is formed.

Current confinement aperture 110 may include an optically active aperture defined by oxidation layer 120. A size of current confinement aperture 110 may range, for example, from approximately 4 μm to approximately 20 μm. In some implementations, a size of current confinement aperture 110 may depend on a distance between trenches 112 that surround emitter 100. For example, trenches 112 may be etched to expose the epitaxial layer from which oxidation layer 120 is formed. Here, before protective layer 114 is formed (e.g., deposited), oxidation of the epitaxial layer may occur for a particular distance (e.g., identified as do in FIG. 1B) toward a center of emitter 100, thereby forming oxidation layer 120 and current confinement aperture 110. In some implementations, current confinement aperture 110 may include an oxide aperture. Additionally, or alternatively, current confinement aperture 110 may include an aperture associated with another type of current confinement technique, such as an etched mesa, a region without ion implantation, lithographically defined intra-cavity mesa and regrowth, or the like.

Top mirror 118 may include a top reflector layer of emitter 100. For example, top mirror 118 may include a DBR.

Implant isolation material 116 may include a material that provides electrical isolation. For example, implant isolation material 116 may include an ion implanted material, such as a hydrogen/proton implanted material or a similar implanted element to reduce conductivity. In some implementations, implant isolation material 116 may define implant protection layer 102.

Protective layer 114 may include a layer that acts as a protective passivation layer and which may act as an additional DBR. For example, protective layer 114 may include one or more sub-layers (e.g., a dielectric passivation layer and/or a mirror layer, a $SiO_2$ layer, a $Si_3N_4$ layer, an $Al_2O_3$ layer, or other layers) deposited (e.g., by chemical vapor deposition, atomic layer deposition, or other techniques) on one or more other layers of emitter 100.

As shown, protective layer 114 may include one or more vias 106 that provide electrical access to ohmic metal layer 104. For example, via 106 may be formed as an etched portion of protective layer 114 or a lifted-off section of protective layer 114. Optical aperture 108 may include a portion of protective layer 114 over current confinement aperture 110 through which light may be emitted.

Ohmic metal layer 104 may include a layer that makes electrical contact through which electrical current may flow. For example, ohmic metal layer 104 may include a Ti and Au layer, a Ti and Pt layer and/or an Au layer, or the like, through which electrical current may flow (e.g., through a bondpad (not shown) that contacts ohmic metal layer 104 through via 106). Ohmic metal layer 104 may be P-ohmic, N-ohmic, or other forms known in the art. Selection of a particular type of ohmic metal layer 104 may depend on the architecture of the emitters and is well within the knowledge of a person skilled in the art. Ohmic metal layer 104 may provide ohmic contact between a metal and a semiconductor and/or may provide a non-rectifying electrical junction and/or may provide a low-resistance contact. In some implementations, emitter 100 may be manufactured using a series of steps. For example, bottom mirror 124, active region 122, oxidation layer 120, and top mirror 118 may be epitaxially grown on substrate layer 126, after which ohmic metal layer 104 may be deposited on top mirror 118. Next, trenches 112 may be etched to expose oxidation layer 120 for oxidation. Implant isolation material 116 may be created via ion implantation, after which protective layer 114 may be deposited. Via 106 may be etched in protective layer 114 (e.g., to expose ohmic metal layer 104 for contact). Plating, seeding, and etching may be performed, after which substrate layer 126 may be thinned and/or lapped to a target thickness. Finally, backside cathode layer 128 may be deposited on a bottom side of substrate layer 126.

The number, arrangement, thicknesses, order, symmetry, or the like, of layers shown in FIG. 1B is provided as an example. In practice, emitter 100 may include additional layers, fewer layers, different layers, differently constructed layers, or differently arranged layers than those shown in FIG. 1B. Additionally, or alternatively, a set of layers (e.g., one or more layers) of emitter 100 may perform one or more functions described as being performed by another set of layers of emitter 100 and any layer may comprise more than one layer.

Figure 1C:
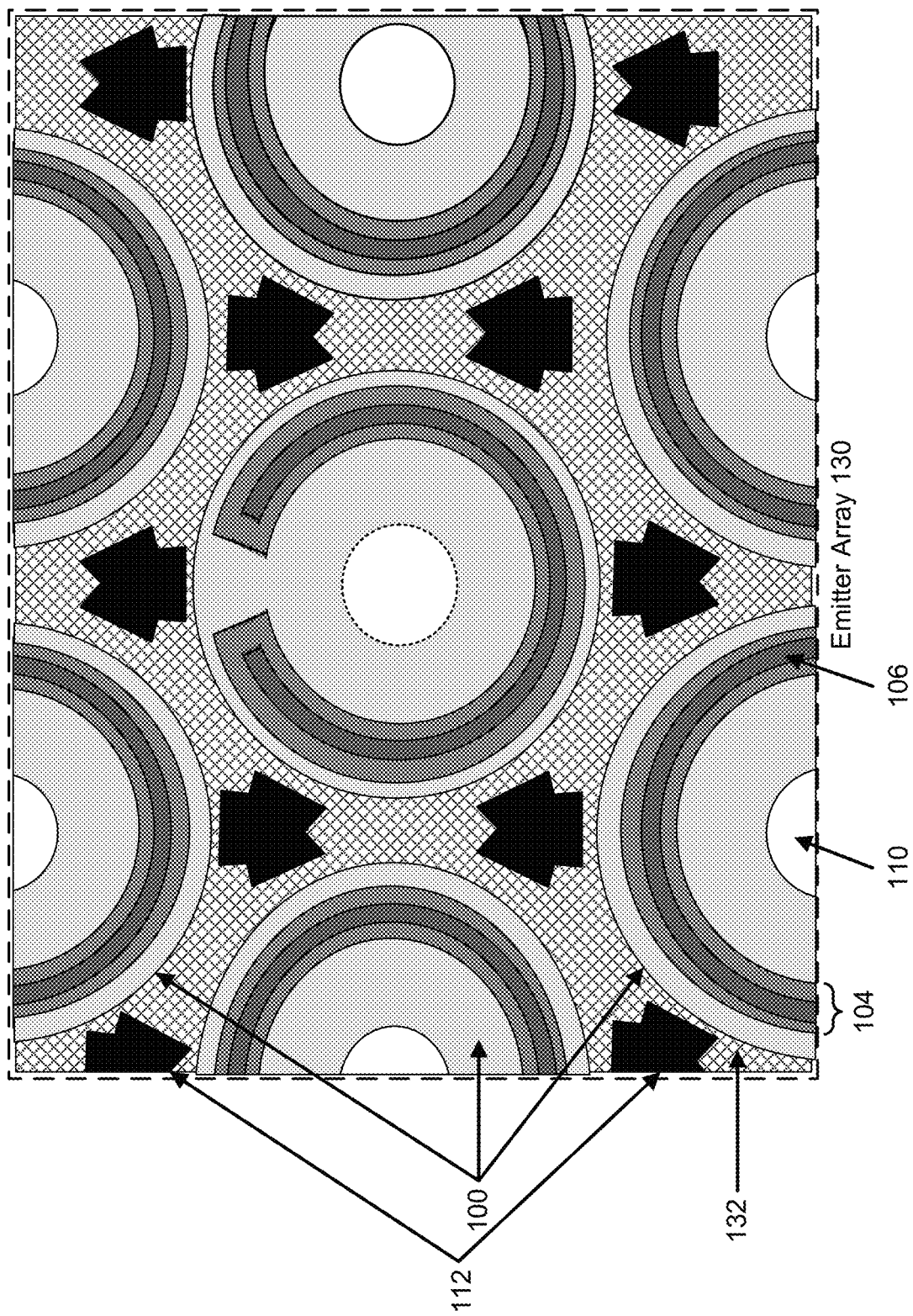
FIG. 1C depicts a prior configuration of emitters of an emitter array.

FIG. 1C depicts a prior configuration of emitters of an emitter array. For example, FIG. 1C shows a portion of an emitter array 130 (as indicated by the dashed lines around emitter array 130). Emitter array 130 includes multiple emitters 100 (each comprising a grouping of white, light gray, medium gray, and dark gray layers and/or structures shown in FIG. 1C) arranged in a two-dimensional pattern. For example, emitter 100 may be a vertical light-emitting device, such as a light-emitting diode (LED), a vertical-cavity surface-emitting laser (VCSEL), a vertical external-cavity surface-emitting laser (VECSEL), and/or the like.

As further shown in FIG. 1C, emitter array 130 may include various trenches 112 (shown in FIG. 1C as black structures). For example, the various trenches 112 may include various oxidation trenches and/or may be located between emitters 100. Continuing with the previous example, adjacent emitters 100 may have one or more trenches 112 between the adjacent emitters 100. As further shown in FIG. 1C, emitter array 130 may include a metallization layer 132 on a surface of emitter array 130 (e.g., shown by the thatched patterning in FIG. 1C). For example, metallization layer 132 may include a layer of gold, silver, aluminum, copper, and/or the like. FIG. 1C only shows portions of metallization layer 132 between emitters 100 to reveal layers and/or structures of emitter array 130 and/or emitters 100 for illustrative and/or explanatory purposes. In practice one or more of the layers and/or structures of emitter array 130 and/or emitter 100 shown in FIG. 1C may be covered by metallization layer 132.

As further shown in FIG. 1C, emitter 100 may include an aperture 110, shown as the white structure. In addition, and as further shown in FIG. 1C, emitter 100 may include an ohmic metal layer 104. For example, ohmic metal layer 104 forms a partial ring around aperture 110. In FIG. 1C, one can consider ohmic metal layer 104 as both the dark gray area and medium gray area with a protective layer (e.g., a dielectric layer) covering ohmic metal layer 104 in the medium gray area and via 106 exposing ohmic metal layer 104 in the dark gray area. Typically, the protective layer covers all of emitter array 130 except for any vias, such as via 106. Alternatively, one can consider the medium gray area as showing a portion of a protective layer having a via 106 through the protective layer to expose ohmic metal layer 104 under the protective layer.

This configuration of emitter array 130 and/or emitters 100 results in a smaller quantity of emitters 100 for particular dimensions of emitter array 130 (e.g., reduced emitter density per square centimeter of chip), larger chip sizes, and/or the like relative to implementations described herein.

Figure 2A:
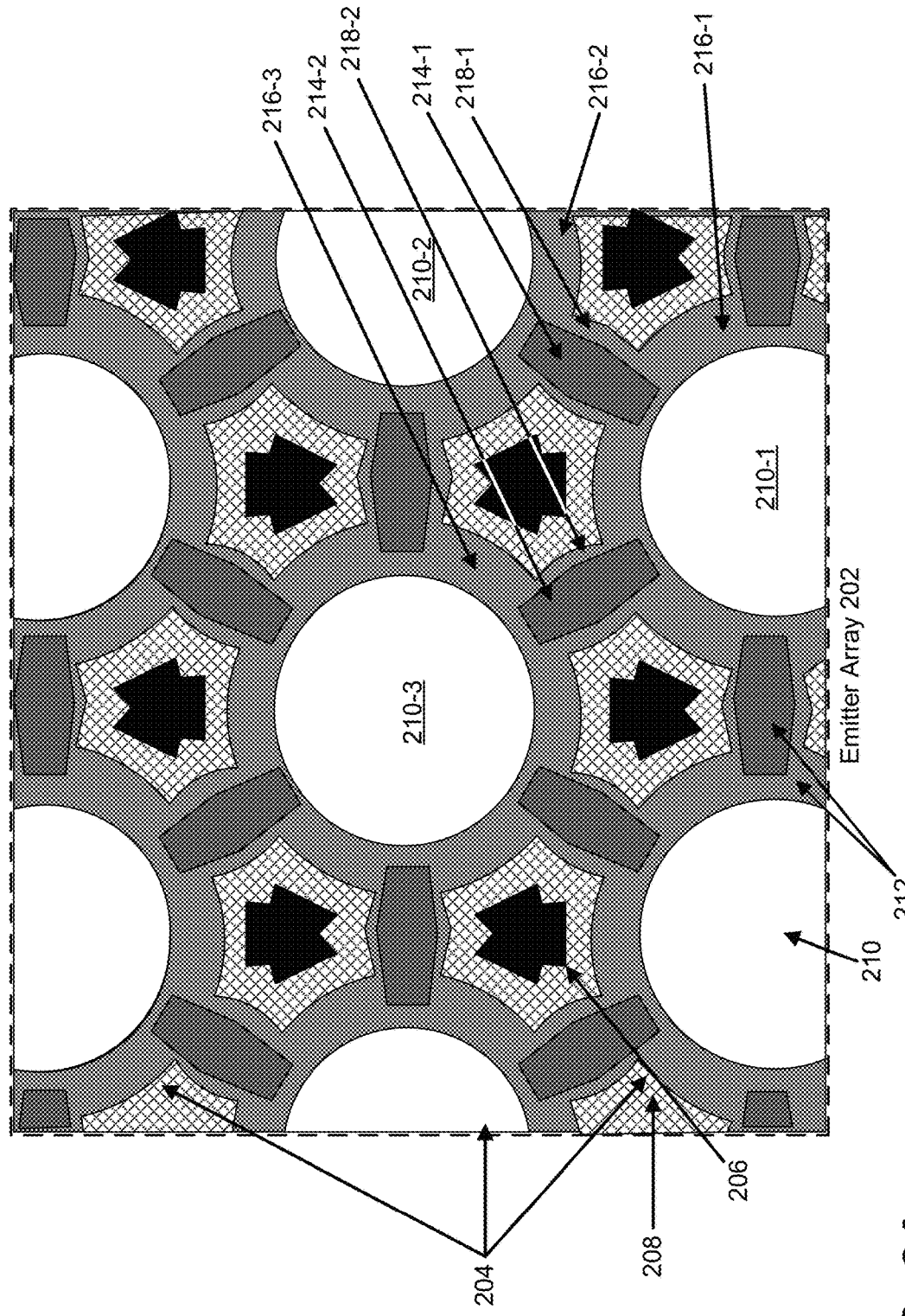
FIGS. 2A and 2B are diagrams of one or more example implementations described herein.

FIG. 2A shows an emitter array 202 of an example implementation, which includes a different configuration of layers and/or structures than emitter array 130 described above. For example, emitter array 202 includes adjacent emitters 204 and one or more trenches 206 between the adjacent emitters 204. In addition, emitter array 202 may include a metallization layer 208 over emitter array 202. Emitter 204 may include an aperture 210, an ohmic metal layer 212, and various vias 214. Via 214 may be shared between adjacent emitters 204. For example, and with regard to sharing, via 214 may be configured with respect to the adjacent emitters 204 such that via 214 is located in an interstitial area (e.g., between the adjacent emitters 204, between apertures (emitting areas) 210 of adjacent emitters 204, between trenches 206 shared by adjacent emitters 204, or an area of emitter array 202 between mesa structures of the adjacent emitters 204) and such that electrical current travels through via 214 to the ohmic metal layer 212 (or a portion thereof), where the ohmic metal layer 212 is shared by the adjacent emitters 204 (e.g., a single via 214 facilitates flow of electrical current to at least two adjacent emitters 204). Similar to emitter array 130, emitter array 202 may include multiple emitters 204 (e.g., arranged in a two-dimensional pattern, or in random or irregular patterns) and one or more trenches 206 between emitters 204. Portions of metallization layer 208 are not shown to reveal a structure and/or layers of emitters 204 and/or emitter array 202, similar to FIG. 1C). Ohmic metal layer 212 is shown by the combination of medium and dark gray areas in FIG. 2A. Portions of ohmic metal layer 212 are shown and described with respect to separate reference numbers. Emitter 204 and/or emitter array 202 may include one or more other layers and/or structures not shown in, or described with regard to, FIG. 2A.

The configuration of emitter array 202 will be described in the context of three emitters 204 of emitter array 202 (e.g., a first emitter 204 associated with aperture 210-1, a second emitter 204 associated with aperture 210-2, and a third emitter 204 associated with aperture 210-3). As shown in FIG. 2A, the first emitter 204 and the second emitter 204 may include a portion 216 of ohmic metal layer 212 around corresponding apertures 210 of the first emitter 204 and the second emitter 204. For example, portion 216-1 may be a ring-shaped layer around aperture 210-1 for the first emitter 204 and portion 216-2 may be a similarly shaped layer around aperture 210-2 for the second emitter 204. In addition, and as further shown in FIG. 2A, a portion 218-1 of ohmic metal layer 212 may electrically connect portion 216-1 around aperture 210-1 and portion 216-2 around aperture 210-2. For example, portion 218-1 of ohmic metal layer 212 may extend from portion 216-1 to portion 216-2 between trenches 206 that are located between the first emitter 204 and the second emitter 204. In this way, the first emitter 204 (and/or aperture 210-1) and the second emitter 204 (and/or aperture 210-2) are electrically connected to each other, share portion 216 (through portions 218), and share one or more vias 214.

Portion 218-1 of ohmic metal layer 212 may be located radially from an adjacent emitter 204 between trenches 206 (e.g., in an interstitial area between the first emitter 204 and the second emitter 204), as shown in FIG. 2A. For example, the first emitter 204 may have a hexagonal arrangement of trenches 206 around the mesa structure of the first emitter 204, and portion 218-1 may be aligned with the trenches 206.

As further shown in FIG. 2A, via 214-1 may expose a portion of ohmic metal layer 212 (e.g., the dark gray area). For example, via 214-1 may extend from a surface of a protective layer (not shown in FIG. 2A) to the portion of ohmic metal layer 212. Additionally, or alternatively, via 214-1 may extend from the surface of the protective layer to portion 216-1 and/or portion 216-2. Although not illustrated in FIG. 2A, metallization layer 208 may extend over the protective layer and into via 214-1 to connect with portions 218-1, 216-1, and/or 216-2 so that electrical current can flow to portions 218-1, 216-1, and/or 216-2. As a result, and in the context of metallization layer 208, vias 214 extend from a bottom surface of metallization layer 208 to a top surface of ohmic metal layer 212 through a protective layer. This is shown in, and described with regard to, the first cross-sectional view along axis A-A in FIG. 3B. As shown in FIG. 2A, via 214-1 is located radially between trenches 206 (e.g., is aligned with trenches 206) in the interstitial area between the first emitter 204 and the second emitter 204. In some implementations, via 214-1 may be radially closer to aperture 210-1 or 210-2 relative to the trenches 206. For example, a radial distance between aperture 210-1 and via 214-1 may be less than a radial distance between aperture 210-1 and the trenches 206 between aperture 210-1 and aperture 210-2.

As further shown in FIG. 2A, other pairs of emitters 204 may similarly include portions 216 (e.g., 216-1, 216-2, 216-3) (e.g., around an aperture 210 of each emitter 204 of the pair of emitters 204) and portions 218 (e.g., 218-1 and 218-2) to electrically connect the portions 216. For example, and with regard to the third emitter 204 associated with aperture 210-3, the first emitter 204 and the second emitter 204 may both be electrically connected to the third emitter 204 via portions (e.g., portions 216 and 218) of ohmic metal layer 212 in a manner similar to that described above. Continuing with the previous example, portion 216-1 may be connected to portion 216-3 around aperture 210-3 by portion 218-2 in manner similar to that by which portion 216-1 is electrically connected to portion 216-2. Based on this, the first emitter 204 may be included in multiple pairs of adjacent emitters 204 (e.g., a first pair that includes the first emitter 204 and the second emitter 204, and a second pair that includes the first emitter 204 and the third emitter 204). In this way, the same emitter 204 may be a member of multiple pairs of emitters 204 based on including a radially spaced configuration of portions 218 to connect the emitter 204 to other adjacent emitters 204 and a portion 216 to connect the portions 218 to each other. Further, this configuration facilitates flow of electrical current to multiple adjacent emitters 204 through via 214. In some implementations, a single via 214 may be used to provide electrical current to emitter array 202 based on the configuration of portions 216 and 218 shown in, and described with respect to, FIG. 2A.

As further shown in FIG. 2A, the ring configuration of portion 216 may electrically connect different portions 218 associated with different pairs of emitters 204 that are adjacent. For example, and with regard to the first emitter 204, portion 216-1 around aperture 210-1 may electrically connect portion 218-1 associated with a first pair of emitters 204 to portion 218-2 associated with a second pair of emitters 204.

In this way, the configuration of emitter array 202 reduces or eliminates a need for some layers and/or structures of emitter 204 to be included in a mesa structure of emitter 204. For example, the configuration of emitter array 202 described herein facilitates removal of a via from a mesa structure of an emitter 204, may facilitate a reduction in a size of a portion of an ohmic metal layer included in a mesa structure of an emitter 204, and/or the like. This facilitates a smaller (e.g., smaller diameter) mesa structure for emitters 204 relative to emitters 100 of emitter array 130 shown in, and described with respect to, FIG. 1C. By facilitating a smaller mesa structure, emitters 204 of emitter array 202 may be spaced closer together than emitters 100 of emitter array 130 (e.g., emitter array 202 may have a reduced emitter to emitter pitch relative to emitter array 130).

Figure 2B:
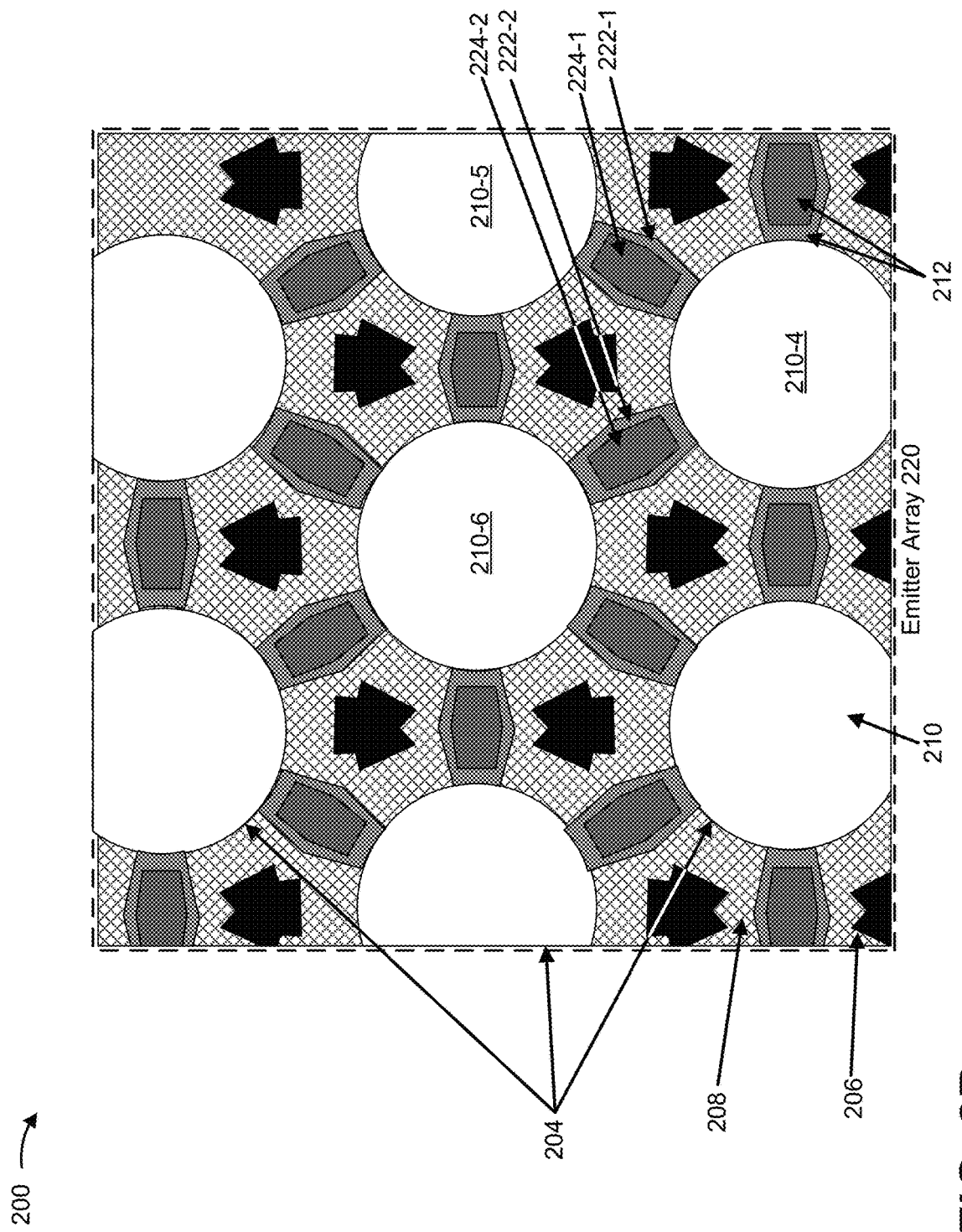

FIG. 2B shows a portion of an emitter array 220 of an example implementation. For example, emitter array 220 may include an ohmic metal layer 212 (shown by the medium and dark gray areas in FIG. 2B) that is configured in a different manner than emitter array 202 described above. Similar to emitter array 202, emitter array 220 may include multiple emitters 204 (e.g., arranged in a two-dimensional pattern) and one or more trenches 206 between emitters 204. In addition, emitter array 220 may include metallization layer 208 (shown in a similar manner as that shown in FIG. 2A with portions of metallization layer 208 not shown to reveal layers and/or structures of emitters 204 and/or emitter array 220). Further, emitter 204 of emitter array 220 may include aperture 210, ohmic metal layer 212, and a set of vias 224, similar to vias 214, associated with ohmic metal layer 212 (e.g., located in an interstitial area between adjacent emitters 204). However, and as will be described below, ohmic metal layer 212, the set of vias 224, and/or other layers and/or structures of emitter 204 and/or emitter array 220 may be configured in a different manner than that described with regard to emitter array 202. Emitter 204 and/or emitter array 220 may include one or more other layers and/or structures not shown in, or described with regard to, FIG. 2B.

The configuration of emitter array 220 will be described in the context of three emitters 204 of emitter array 220 (e.g., a fourth emitter 204 associated with aperture 210-4, a fifth emitter 204 associated with aperture 210-5, and a sixth emitter 204 associated with aperture 210-6). As shown in FIG. 2B, the fourth emitter 204 associated with aperture 210-4 may be associated with a portion 222-1 of ohmic metal layer 212. As shown, portion 222-1 may extend from aperture 210-4 to aperture 210-5, in a manner similar to that described above with regard to portions 216 and 218. In this way, portion 222-1 may electrically connect the fourth emitter 204 (and/or aperture 210-4) to the fifth emitter 204 (and/or aperture 210-5). As further shown in FIG. 2B, a portion of portion 222-1 of ohmic metal layer 212 may be exposed by a via 224-1. Via 224-1 may be similar to vias 214 described above in connection with FIG. 2A. For example, via 224 may be located in an interstitial area (e.g., between adjacent emitters 204 or extending between mesas of adjacent emitters). In addition, via 224 may be associated with a corresponding portion 222 that electrically connects adjacent emitters 204 to facilitate flow of electrical current into the adjacent emitters 204. Portion 222-1 and/or via 224-1 may be configured relative to other layers and/or structures of emitter array 220 in a manner similar to that described with regard to emitter array 202. For example, portion 222-1 may extend radially between trenches 206 from aperture 210-4 to aperture 210-5, and multiple portions 222 (and corresponding vias 224) associated with emitter 204 may be in a radially spaced configuration around aperture 210 of emitter 204. Additionally, or alternatively, and as another example, via 224-1 may be positioned radially between the same trenches 206 as portion 222-1, may be located closer to aperture 210-4 or aperture 210-5 relative to trenches 206 between the fourth emitter 204 and the fifth emitter 204, and/or the like.

Different from emitters 204 described in connection with emitter array 202 of FIG. 2A, emitters 204 of emitter array 220 may not have corresponding portions similar to portion 216. For example, unlike emitters 204 of emitter array 202, portions 222 associated with emitters 204 of emitter array 220 may be physically isolated from each other (e.g., may not be electrically connected to each other in the ohmic metal layer 212, or may be separate portions). For example, portion 222-1 and portion 222-2 may be electrically isolated from each other based on the first emitter 204 not including a portion of ohmic metal layer 212 similar to portion 216 described in connection with FIG. 2A, however, portion 222-1 and portion 222-2 may still be electrically connected through metallization layer 208 which connects to them through vias 224-1 and 224-2 and/or within the mesa of emitters 204.

This configuration of layers and/or structures of emitter 204 and/or emitter array 220 further facilitates a reduction in mesa size of emitter 204 relative to emitter array 130 and/or emitter array 202. This facilitates a further reduction in emitter-to-emitter distance relative to emitter array 130 and/or emitter array 202.

In this way, implementations described herein provide emitter array 202 and/or emitter array 220 where a via is shared between two adjacent emitters 204. For example, the via may be located in an interstitial area between a pair of adjacent emitters 204 to facilitate flow of electric current to at least a portion (e.g., portion 218 and/or portion 222) of ohmic metal layer 212 that electrically connects one emitter 204 of the pair of adjacent emitters 204 to another emitter 204 of the pair of emitters 204 where the portion is also located in the interstitial area. This configuration reduces or eliminates a need for some layers and/or structures to be included in a mesa structure of emitter 204. For example, the configuration of emitter array 220 described herein facilitates removal of a portion of ohmic metal layer 212 from a mesa structure of an emitter 204, facilitates removal of a via from a mesa structure of an emitter 204, and/or the like. This facilitates a smaller mesa size of emitter 204 relative to the configuration of emitter array 202, thereby facilitating a reduction in distance between emitters 204 of emitter array 202 and/or emitter array 220. The reduction in distance facilitates use of a smaller chip for emitter array 202 and/or emitter array 220 than for emitter array 130, which conserves costs and/or materials associated with manufacturing emitter array 202 and/or emitter array 220. In addition, this facilitates including a higher quantity of emitters 204 on a chip of a particular size, thereby improving a utilization of an area of the chip. Further, a reduction in a mesa size of emitter 204 facilitates wider manufacturing tolerances with regard to manufacturing emitter array 202 and/or emitter array 220 relative to emitter array 130.

As indicated above, FIGS. 2A and 2B are provided merely as one or more examples. Other examples may differ from what is described with regard to FIGS. 2A and 2B.

Figure 3A:
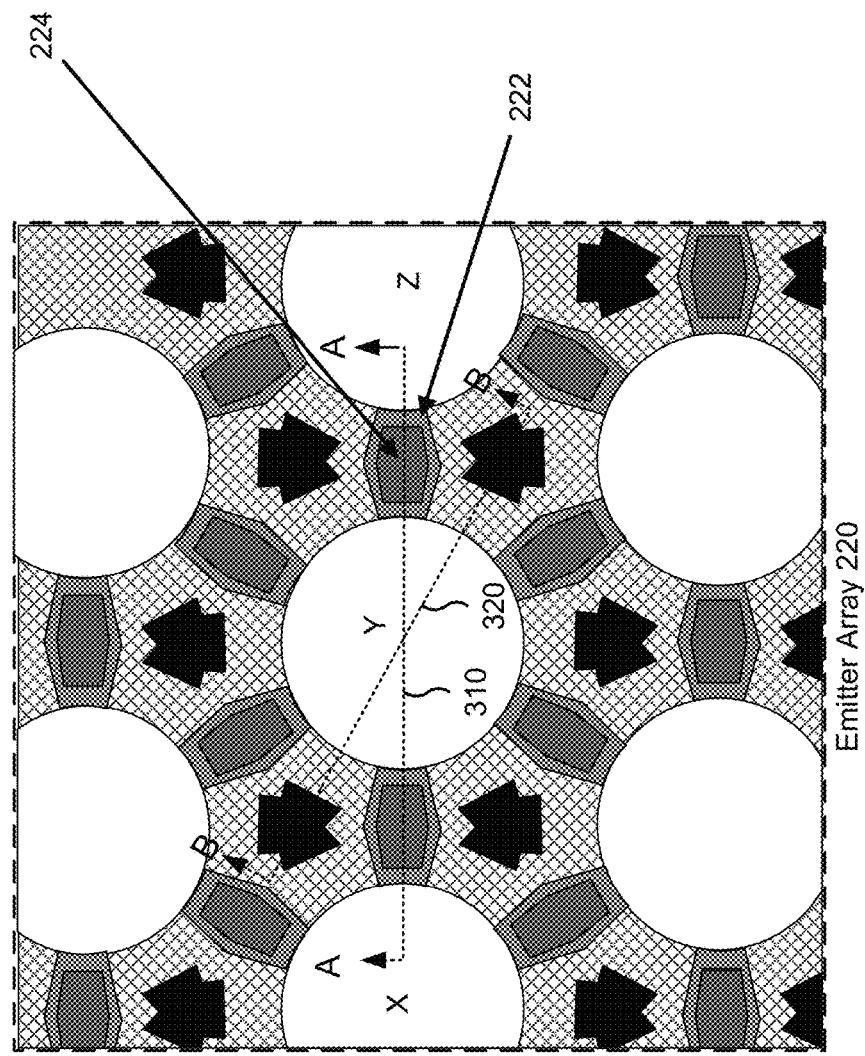
FIGS. 3A and 3B are diagrams depicting a top-view of another example implementation and cross-sectional views of that example implementation, respectively.
Figure 3B:
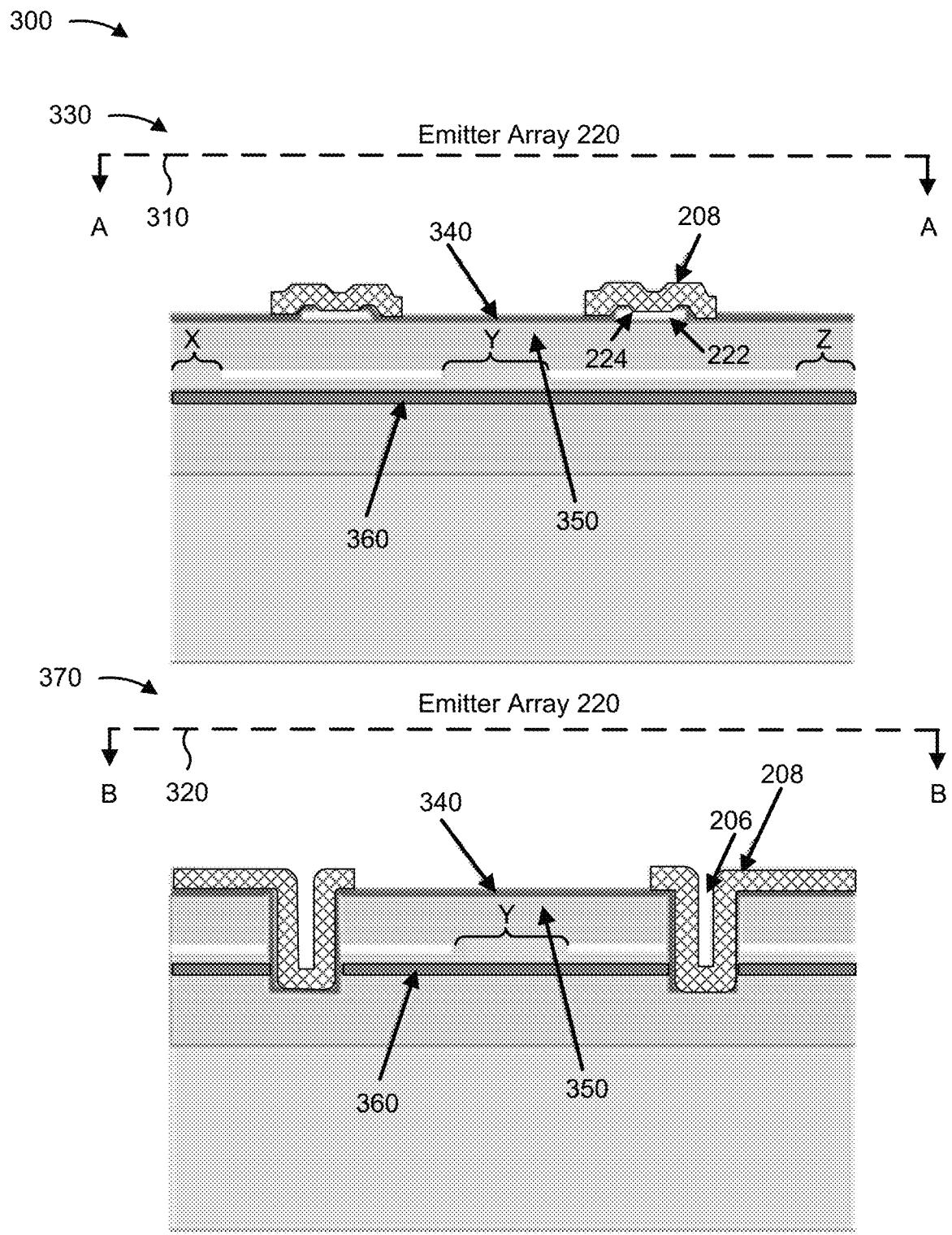

FIGS. 3A and 3B are diagrams 300 depicting a top-view of another example implementation and cross-sectional views of that example implementation, respectively. FIG. 3A shows a top-view of a portion of emitter array 220 similar to that shown in FIG. 2B described above. Reference number 310 shows an axis A-A along which a first cross-sectional view of a portion of emitter array 220 is shown in FIG. 3B. For example, axis A-A extends from aperture X through aperture Y to aperture Z of adjacent emitters. Reference number 320 shows an axis B-B along which a second cross-sectional view of a portion of emitter array 220 is shown in FIG. 3B. For example, axis B-B extends from an interstitial area through a first trench 206 (reference number not shown), through aperture Y, through a second trench 206 (reference number not shown), and to another interstitial area.

Turning to FIG. 3B, reference number 330 shows the first cross-sectional view of a portion of emitter array 220 along axis A-A. The first cross-sectional view shows portions of metallization layer 208 on portions 222 of ohmic metal layer 212. As further shown in the first cross-sectional view, portions of metallization layer 208 contact the portions 222 through corresponding vias 224. This is shown in the first cross-sectional view of FIG. 3B by an indent in metallization layer 208 where a protective layer 340 is absent. Via 224 may be etched from a top surface of protective layer 340 down to the top of a portion 222 of ohmic metal layer 212 (reference number for ohmic metal layer 212 not shown). Via 224 may be formed before metallization layer 208 is formed.

In addition, the first cross-sectional view shows other layers and/or structures of the portion of emitter array 220. For example, the first cross-sectional view shows protective layer 340, oxidation layer 350, and active layer 360. As illustrated in FIG. 3A, electrical current from metallization layer 208 would flow through portion 222 of ohmic metal layer 212 in the area between emitters 204, through aperture Y and through aperture Z. The electrical current is shared between these adjacent emitters 204. In some embodiments, an implant isolation layer may be provided beneath portion 222 of ohmic metal layer 212 extending down into oxidation layer 350 to assist with sharing of electrical current between adjacent emitters 204.

Reference number 370 shows the second cross-sectional view of a portion of emitter array 220 along axis B-B. The second cross-sectional view shows portions of metallization layer 208 and portions of one or more trenches 206. In addition, the second cross-sectional view shows other layers and/or structures of the portion of emitter array 220, similar to that shown, and described, in connection with the first cross-sectional view.

As indicated above, FIGS. 3A and 3B are provided merely as one or more examples. Other examples may differ from what is described with regard to FIGS. 3A and 3B.

FIG. 4 is a flow chart of an example process 400 for forming an emitter array with shared via to an ohmic metal shared between adjacent emitters. For example, FIG. 4 shows an example process 400 for manufacturing emitter array 202 and/or emitter array 220 described above. Notably, while example process 400 is described in the context of manufacturing emitter array 202 and/or emitter array 220, the implementations described with respect to process 400 apply equally to other types of emitter arrays with a shared via to an ohmic metal shared between adjacent emitters.

As shown in FIG. 4, process 400 may include forming two adjacent lasers on or within a substrate (block 410). For example, process 400 may include forming a plurality of lasers (e.g., emitters 204 of emitter array 202 and/or emitter array 220) on or within a substrate. To form the plurality of lasers, various epitaxial layers may be formed on a substrate layer (e.g., a gallium arsenide (GaAs) substrate and/or the like). The plurality of lasers may be formed in a pattern, such as a two-dimensional pattern (e.g., a grid pattern, a hexagonal pattern, a random pattern, an irregular pattern, and/or the like).

As further shown in FIG. 4, process 400 may include forming, in association with forming the two adjacent lasers, an ohmic metal layer including forming a portion of the ohmic metal layer shared by, and in a location between, the two adjacent lasers (block 420). For example, process 400 may include forming ohmic metal layer 212 of emitter array 202 and/or emitter array 220. In some implementations, forming the ohmic metal layer may include forming portions 218 of emitter array 202 and/or portions 222 of emitter array 220, where portions 218 and/or 222 are shared by, and in a location between, the two adjacent lasers. In some implementations, the ohmic metal layer may be formed after, or in conjunction with, forming the two adjacent lasers.

In some implementations, process 400 may include forming adjacent trenches (e.g., trenches 206 of emitter array 202 and/or 220) associated with the two adjacent lasers (e.g., between the two adjacent lasers). Etching (e.g., wet etching, dry etching, and/or the like) may be used to form the adjacent trenches.

As further shown in FIG. 4, process 400 may include forming, in association with forming the ohmic metal layer, a protective layer over the laser array (block 430). For example, process 400 may include forming protective layer 114, 340 over emitter array 202 and/or emitter array 220 (e.g., over at least metallization layer 208 or over at least ohmic metal layer 212). In some implementations, forming the protective layer may include forming the protective layer after, or in conjunction with, forming the ohmic metal layer.

As further shown in FIG. 4, process 400 may include forming, in association with forming the protective layer, a via through the protective layer to the ohmic metal layer (block 440). For example, a via may be formed through the protective layer from a top surface of the protective layer to a top layer of the ohmic metal layer. In some implementations, forming the via may include forming the via after, or in conjunction with, forming the protective layer. In some implementations, a metallization layer (e.g., metallization layer 208) may be formed on the protective layer after forming the via.

Process 400 may include additional implementations, such as any single implementation or any combination of implementations described below and/or in connection with one or more other processes described elsewhere herein.

In some implementations, forming the via comprises forming the via over the portion and such that the via is shared between the adjacent lasers. In some implementations, forming the via comprises forming the via in an interstitial area adjacent to the two adjacent lasers. In some implementations, forming the ohmic metal layer comprises forming additional portions of the ohmic metal layer, wherein the additional portions are physically separate from the portion of the ohmic metal layer. In some implementations, forming the ohmic metal layer comprises forming the portion and the additional portions in a radially spaced configuration around one of the two adjacent lasers. In some implementations, forming the via comprises forming the via radially between a pair of trenches shared by the two adjacent lasers.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

As used herein the term "layer" is intended to be broadly construed as one or more layers and includes layers oriented horizontally, vertically, or at other angles. Although FIGS. 1C, 2A and 2B illustrate regular grid arrangements of adjacent emitters, irregular and non-grid arrangements of adjacent emitters are equally within the scope of the embodiments described herein. Where comparison has been made between emitters with some specified differences, it is to be understood that other parameters not identified (e.g., aperture sizes, oxidation trench sizes, power and/or wavelength) would be kept the same for the purposes of that comparison.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A vertical cavity surface emitting laser (VCSEL) array, comprising:
    a plurality of VCSELs including two adjacent VCSELs;
    an ohmic metal layer associated with the plurality of VCSELs; and
    a protective layer over the ohmic metal layer,
        wherein the protective layer includes a via to the ohmic metal layer,
            wherein the via is shared, and located, between the two adjacent VCSELs of the plurality of VCSELs.

2. The VCSEL array of claim 1, wherein the via is located in an interstitial area adjacent to the two VCSELs.

3. The VCSEL array of claim 1, wherein the ohmic metal layer comprises separate portions with corresponding vias, wherein the via is one of the corresponding vias and included in one of the separate portions.

4. The VCSEL array of claim 3, wherein the separate portions are located in corresponding interstitial areas between adjacent VCSELs of the plurality of VCSELs, wherein the one of the separate portions is located between the two adjacent VCSELs.

5. The VCSEL array of claim 1, wherein the ohmic metal layer comprises a portion that extends between corresponding apertures of the two adjacent VCSELs.

6. The VCSEL array of claim 1, wherein the via is located radially between a pair of trenches shared by the two adjacent VCSELs.

7. The VCSEL array of claim 1, wherein a radial distance between an aperture of one of the two adjacent VCSELs and the via is less than another radial distance between the aperture and a trench between the two adjacent VCSELs.

8. An emitter array, comprising:
    a plurality of emitters that includes two adjacent emitters;
    an ohmic metal layer associated with the plurality of emitters,
        wherein the ohmic metal layer includes a portion that is shared by, and located between, the two adjacent emitters;
    a protective layer over the ohmic metal layer; and
    a via through the protective layer to the portion,
        wherein the via is shared by, and located between, the two adjacent emitters.

9. The emitter array of claim 8, wherein the via is located in an interstitial area between the two adjacent emitters.

10. The emitter array of claim 8, wherein the ohmic metal layer comprises one or more other portions that are separate from the portion,
    wherein the one or more other portions are associated with corresponding vias,
    wherein the one or more other portions are associated with other emitters, of the emitter array, that are adjacent to one of the two adjacent emitters.

11. The emitter array of claim 10, wherein the ohmic metal layer includes another portion associated with the one of the two adjacent emitters,
    wherein the other portion electrically connects the portion and the one or more other portions to each other.

12. The emitter array of claim 8, wherein the via and the portion are located radially between two adjacent trenches between the two adjacent emitters.

13. The emitter array of claim 8, wherein the portion electrically connects corresponding apertures of the two adjacent emitters.

14. The emitter array of claim 8, wherein a radial distance between an aperture of one of the two adjacent emitters and the via is less than a radial distance between the aperture and a trench between the two adjacent emitters.

15. A method of forming a laser array, comprising:
    forming two adjacent lasers on or within a substrate;
    forming, in association with forming the two adjacent lasers, an ohmic metal layer including forming a portion of the ohmic metal layer shared by, and in a location between, the two adjacent lasers;
    forming, in association with forming the ohmic metal layer, a protective layer over the laser array; and
    forming, in association with forming the protective layer, a via located between the two adjacent lasers through the protective layer to the ohmic metal layer.

16. The method of claim 15, wherein forming the via comprises:

forming the via over the portion and such that the via is shared between the adjacent lasers.

17. The method of claim 15, wherein forming the via comprises:
   forming the via in an interstitial area adjacent to the two adjacent lasers.

18. The method of claim 15, wherein forming the ohmic metal layer comprises:
   forming additional portions of the ohmic metal layer,
   wherein the additional portions are physically separate from the portion of the ohmic metal layer.

19. The method of claim 18, wherein forming the ohmic metal layer comprises:
   forming the portion and the additional portions in a radially spaced configuration around one of the two adjacent lasers.

20. The method of claim 15, wherein forming the via comprises:
   forming the via radially between a pair of trenches shared by the two adjacent lasers.

\* \* \* \* \*